(12) United States Patent
Sakuragi et al.

(10) Patent No.: US 10,700,546 B2
(45) Date of Patent: Jun. 30, 2020

(54) CIRCUIT DESIGN APPARATUS, BACKUP POWER SUPPLY, CIRCUIT DESIGN PROGRAM, AND CAPACITOR ENERGY AMOUNT CALCULATION METHOD

(71) Applicant: Murata Manufacturing Co., Ltd., Nagaokakyo-shi, Kyoto-fu (JP)

(72) Inventors: Atsushi Sakuragi, Nagaokakyo (JP); Takanori Hibino, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 386 days.

(21) Appl. No.: 15/386,159

(22) Filed: Dec. 21, 2016

(65) Prior Publication Data

US 2017/0179761 A1 Jun. 22, 2017

(30) Foreign Application Priority Data

Dec. 22, 2015 (JP) ................................ 2015-249944

(51) Int. Cl.
| | |
|---|---|
| *H02J 9/06* | (2006.01) |
| *G01R 31/387* | (2019.01) |
| *G01R 27/26* | (2006.01) |
| *H01G 4/255* | (2006.01) |
| *G11C 5/14* | (2006.01) |
| *H02J 7/34* | (2006.01) |
| *G06F 1/30* | (2006.01) |
| *G11C 16/30* | (2006.01) |

(Continued)

(52) U.S. Cl.
CPC .............. *H02J 9/061* (2013.01); *G01R 27/26* (2013.01); *G01R 31/387* (2019.01); *G06F 1/30* (2013.01); *G11C 5/141* (2013.01); *G11C 16/30* (2013.01); *H01G 4/12* (2013.01); *H01G 4/255* (2013.01); *H01G 4/30* (2013.01); *H01G 4/38* (2013.01); *H02J 7/345* (2013.01)

(58) Field of Classification Search
CPC . H02J 9/061; H02J 7/345; H01G 4/12; H01G 4/30; H01G 4/38; H01G 4/255; G01R 27/26; G01R 31/3634; G01R 31/387; G11C 16/30; G11C 5/141; G06F 1/30
USPC .......................................................... 703/14
See application file for complete search history.

(56) References Cited

U.S. PATENT DOCUMENTS 7,269,810 B1 * 9/2007 Weller ................ G06F 17/5022
716/115
2010/0332896 A1 * 12/2010 Wilson ...................... G06F 1/30
714/14
(Continued)

FOREIGN PATENT DOCUMENTS

CN 102257453 A 11/2011
JP 2014-063209 A 4/2014
(Continued)

*Primary Examiner* — Eunhee Kim
(74) *Attorney, Agent, or Firm* — Keating & Bennett, LLP

(57) ABSTRACT

A circuit design apparatus includes a storage that stores a first capacitance of a capacitor associated with one or more usage conditions, and a controller that controls an amount of energy of the capacitor under a specified usage condition of the one or more usage conditions. The controller calculates a second capacitance under the specified usage condition based on a first relationship between the specified usage condition and the first capacitance, and calculates the amount of energy of the capacitor based on the calculated second capacitance.

20 Claims, 9 Drawing Sheets

(51) Int. Cl.
  *H01G 4/12* (2006.01)
  *H01G 4/30* (2006.01)
  *H01G 4/38* (2006.01)

(56) References Cited

U.S. PATENT DOCUMENTS

| | | | |
|---|---|---|---|
| 2015/0069934 A1* | 3/2015 | Gardner | B41J 2/04568 318/116 |
| 2016/0146871 A1* | 5/2016 | Saito | G01R 27/2605 324/679 |
| 2016/0179736 A1* | 6/2016 | Qi | G06F 13/42 710/105 |

FOREIGN PATENT DOCUMENTS

| | | |
|---|---|---|
| WO | 2011/068549 A1 | 6/2011 |
| WO | 2015/015910 A1 | 2/2015 |

* cited by examiner

FIG. 9

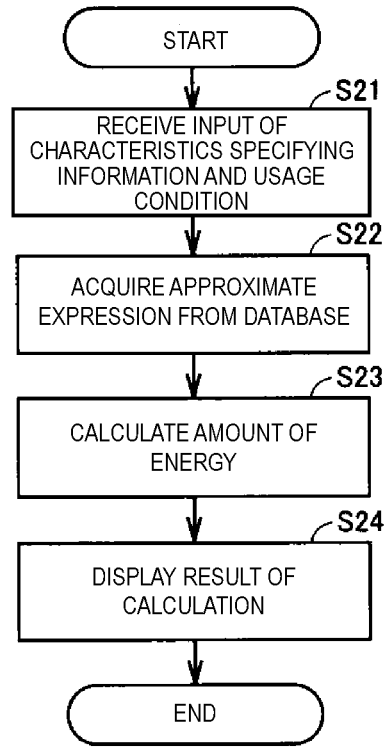

```
              START
                │
                ▼         ┌─S21
    ┌───────────────────────┐
    │  RECEIVE INPUT OF     │
    │  CHARACTERISTICS      │
    │  SPECIFYING           │
    │  INFORMATION AND USAGE│
    │  CONDITION            │
    └───────────────────────┘
                │         ┌─S22
                ▼
    ┌───────────────────────┐
    │  ACQUIRE APPROXIMATE  │
    │  EXPRESSION FROM      │
    │  DATABASE             │
    └───────────────────────┘
                │         ┌─S23
                ▼
    ┌───────────────────────┐
    │  CALCULATE AMOUNT OF  │
    │  ENERGY               │
    └───────────────────────┘
                │         ┌─S24
                ▼
    ┌───────────────────────┐
    │  DISPLAY RESULT OF    │
    │  CALCULATION          │
    └───────────────────────┘
                │
                ▼
              END
```

| CHIP | : | XXX | |
|---|---|---|---|
| MATERIAL | : | MMM | |
| TEMPERATURE | : | 25 | °C |
| VOLTAGE AGING | : | ∞ | min |
| | | | |
| DISCHARGE START VOLTAGE V1 | : | 33.5 | V |
| DISCHARGE END VOLTAGE V2 | : | 7.0 | V |
| REQUIRED AMOUNT OF ENERGY E | : | 40 | mJ |

⬇

| AMOUNT OF ENERGY PER CHIP | : | 1.00 | mJ/pcs |
|---|---|---|---|
| REQUIRED NUMBER OF CHIPS | : | 40 | pcs |

FIG. 11A

| REQUIRED AMOUNT OF ENERGY | 40mJ | |
|---|---|---|
| TEMPERATURE (°C) | 85°C | |
| AGING | 5 YEARS | |
| DISCHARGE START VOLTAGE | 33.5V | |
| DISCHARGE END VOLTAGE | 7V | |
| SAMPLE NAME | REQUIRED NUMBER OF CHIPS CALCULATED USING METHOD IN THE RELATED ART | REQUIRED NUMBER OF CHIPS CALCULATED USING METHOD ACCORDING TO EMBODIMENT OF THE PRESENT INVENTION | REDUCTION RATE |
| A | 45pcs (0.90mJ/pcs) | 37pcs (1.11mJ/pcs) | 18% (8 CHIPS) |

FIG. 11B

| TEMPERATURE (°C) | 85°C | |
|---|---|---|
| AGING | 5 YEARS | |
| DISCHARGE START VOLTAGE | 33.5V | |
| DISCHARGE END VOLTAGE | 7V | |
| SAMPLE NAME | ACTUALLY MEASURED VALUE (mJ) | VALUE OBTAINED BY CALCULATION ACCORDING TO EMBODIMENT OF THE PRESENT INVENTION (mJ) | ERROR (%) |
| A (37pcs) | 41.3 | 41.1 | 0.5 |

FIG. 12A

| TEMPERATURE (°C) | 0 | | | | | |
|---|---|---|---|---|---|---|
| AGING | 1min | | | | | |
| DISCHARGE START VOLTAGE (V) | 33.5 | | | 20 | | |
| DISCHARGE END VOLTAGE (V) | 7 | | | 7 | | |
| SAMPLE NAME | ACTUALLY MEASURED VALUE (mJ) | CALCULATED VALUE (mJ) | ERROR (%) | ACTUALLY MEASURED VALUE (mJ) | CALCULATED VALUE (mJ) | ERROR (%) |
| A (24pcs) | 37.9 | 37.3 | -1.6 | 16.4 | 16.0 | -2.4 |
| B (70pcs) | 49.7 | 48.9 | -1.8 | 24.6 | 24.0 | -2.4 |
| C (78pcs) | 50.1 | 49.2 | -1.8 | 25.3 | 23.9 | -5.5 |
| D (18pcs) | 25.7 | 24.2 | -5.8 | 10.6 | 10.1 | -4.7 |

FIG. 12B

| TEMPERATURE (°C) | 25 | | | | | |
|---|---|---|---|---|---|---|
| AGING (hr) | 48 | | | | | |
| DISCHARGE START VOLTAGE (V) | 33.5 | | | 20 | | |
| DISCHARGE END VOLTAGE (V) | 7 | | | 7 | | |
| SAMPLE NAME | ACTUALLY MEASURED VALUE (mJ) | CALCULATED VALUE (mJ) | ERROR (%) | ACTUALLY MEASURED VALUE (mJ) | CALCULATED VALUE (mJ) | ERROR (%) |
| A (24pcs) | 26.3 | 24.7 | -6.1 | 11.3 | 10.9 | -3.5 |
| B (70pcs) | 43.9 | 42.9 | -2.2 | 19.7 | 20.1 | 2.0 |
| C (78pcs) | 40.7 | 40.9 | 0.5 | 18.1 | 18.6 | 2.3 |

FIG. 12C

| TEMPERATURE (°C) | 85 | | |
|---|---|---|---|
| AGING (hr) | 24 | | |
| DISCHARGE START VOLTAGE (V) | 33.5 | | |
| DISCHARGE END VOLTAGE (V) | 7 | | |
| SAMPLE NAME | ACTUALLY MEASURED VALUE (mJ) | CALCULATED VALUE (mJ) | ERROR (%) |
| A (24pcs) | 26.9 | 26.4 | -1.9 |
| B (70pcs) | 59.2 | 59.5 | -0.5 |
| C (78pcs) | 49.4 | 51.1 | -2.4 |

CIRCUIT DESIGN APPARATUS, BACKUP POWER SUPPLY, CIRCUIT DESIGN PROGRAM, AND CAPACITOR ENERGY AMOUNT CALCULATION METHOD

CROSS REFERENCE TO RELATED APPLICATIONS

This application claims the benefit of priority to Japanese Patent Application No. 2015-249944 filed on Dec. 22, 2015. The entire contents of this application are hereby incorporated herein by reference.

BACKGROUND OF THE INVENTION

1. Field of the Invention

The present invention relates to a circuit design apparatus, a backup power supply, a circuit design program, and a capacitor energy amount calculation method.

2. Description of the Related Art

Memories each including a backup power supply have been known. For example, Japanese Unexamined Patent Application Publication No. 2014-63209 discloses a flash memory including a backup power supply including a capacitor.

In recent years, there have been advances in the reduction in size and profile of flash memories. The reduction in profile of a backup power supply in such a flash memory is therefore needed.

As a backup power supply in a flash memory, for example, a conducting polymer capacitor or an electric double-layer capacitor (EDLC) is known. However, it may be difficult for these capacitors to flexibly adapt to the reduction in profile, because they have a configuration in which a small number of thick layers are covered with a resin package.

In the case of multi-layer ceramic capacitors (MLCCs), the reduction in profile is relatively easily achieved by reducing a large number of thin ceramic layers therein. However, it is known that some of MLCCs used as capacitors in backup power supplies have characteristics in which a capacitance significantly changes in accordance with an applied voltage, a voltage application period, or a temperature.

Energy supplied by a capacitor is calculated using equation (1) where C represents a capacitance, V1 represents a discharge start voltage, and V2 represents a discharge end voltage.

$$\text{The amount of energy} = 1/2 \cdot C \cdot (V1^2 - V2^2) \quad (1)$$

A capacitor energy amount calculation method in the related art represented by equation (1) is based on the assumption that the capacitance of a capacitor is substantially constant. In a case where the amount of energy of a capacitor such as an MLCC whose capacitance varies in accordance with a usage environment is calculated using the capacitor energy amount calculation method in the related art, a calculated amount of energy may be different from an actual amount of energy. For example, in a case where the number of MLCCs required as a backup power supply is calculated, the amount of energy of the MLCCs is calculated under the assumption that these MLCCs have the lowest capacitance in a usage environment. As a result, the calculated required number of MLCCs may exceed the actual required number of MLCCs. The increase in the required number of MLCCs makes it difficult to reduce the profile of a backup power supply including the MLCCs because of a limited footprint.

SUMMARY OF THE INVENTION

Preferred embodiments of the present invention provide a circuit design apparatus, a circuit design program, and a capacitor energy amount calculation method with which the amount of energy of a capacitor is able to be appropriately calculated.

A circuit design apparatus according to a preferred embodiment of the present invention includes a storage that stores a first capacitance of a capacitor associated with one or more usage conditions and a controller that controls an amount of energy of the capacitor under specified one of the usage conditions. The controller calculates a second capacitance under the specified usage condition on the basis of a first relationship between the specified usage condition and the first capacitance and calculates the amount of energy of the capacitor on the basis of the calculated second capacitance.

According to a preferred embodiment of the present invention, it is possible to appropriately calculate the amount of energy of a capacitor by using an energy amount calculation method that takes a usage condition into consideration. The required number of capacitors calculated using a method according to a preferred embodiment of the present invention becomes smaller than that calculated using a method in the related art. This leads to the reduction in footprint, and the further reduction in size and profile of a flash memory is able to be achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a flowchart describing a process of calculating the amount of energy of a capacitor.

FIG. 10 is a diagram illustrating a screen used to input information specifying the characteristics of a capacitor and the usage condition of the capacitor.

FIGS. 11A and 11B are diagrams describing the usefulness of an energy amount calculation method according to a preferred embodiment of the present invention.

FIGS. 12A, 12B and 12C are diagrams illustrating results of a comparison between an actually measured amount of energy of a capacitor and an amount of energy calculated using a calculation method according to a preferred embodiment of the present invention under a usage condition different from that in FIG. 11B.

DETAILED DESCRIPTION OF THE PREFERRED EMBODIMENTS

Figure 1:
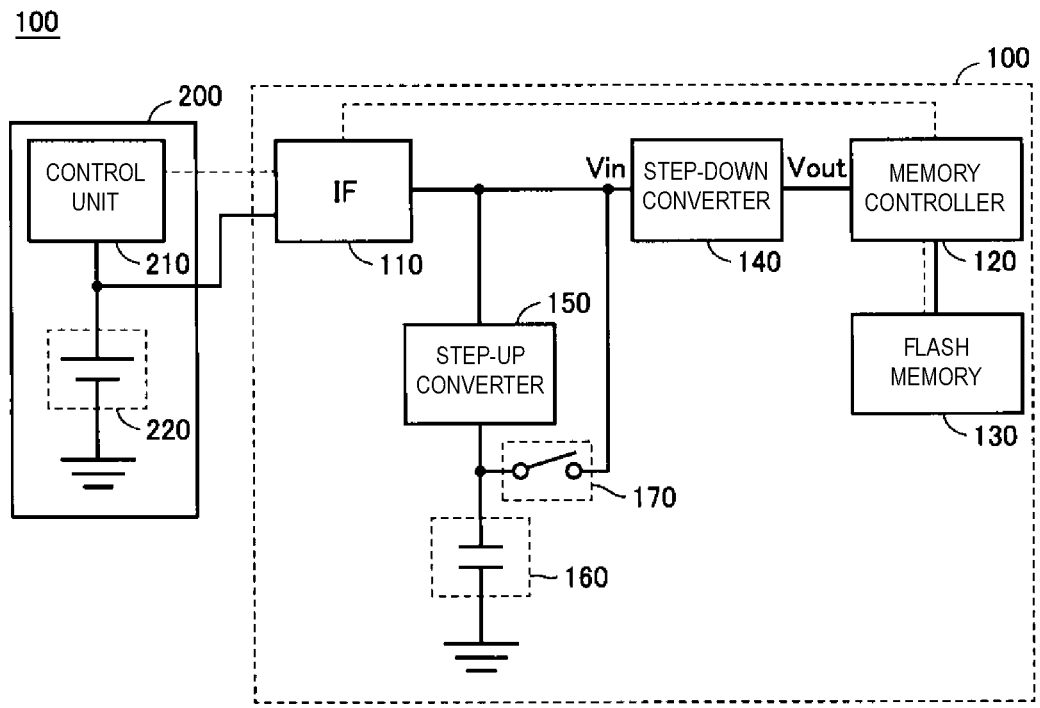
FIG. 1 is a diagram illustrating a functional configuration of a solid state drive (SSD) designed by a circuit design apparatus according to a preferred embodiment of the present invention.

Preferred embodiments of the present invention will be described in detail below with reference to the accompanying drawings. In the drawings, the same reference numeral is used to represent the same component or the same element so as to avoid repeated explanation.

FIG. 1 is a diagram illustrating a functional configuration of a solid state drive (SSD) 100 designed by a circuit design apparatus according to a preferred embodiment of the present invention. The SSD 100 includes an interface 110, a memory controller 120, a flash memory 130, a step-down converter 140, a step-up converter 150, a backup power supply 160, and a switch 170.

The SSD 100 is connected to a host system 200 via the interface 110. The interface 110 supplies a signal and power from the host system 200 to the SSD 100. The interface 110 includes, for example, integrated drive electronics (IDE) or a universal serial bus (USB).

Upon receiving an instruction from a controller 210 in the host system 200, the memory controller 120 performs writing of data into the flash memory 130 or the transmission of data stored in the flash memory 130 to the host system 200. The flash memory 130 includes, for example, a NAND-type flash memory.

The step-down converter 140 steps down a power supply voltage Vin supplied from a power supply 220 in the host system 200 to an operating voltage Vout, and supplies the operating voltage Vout to the memory controller 120 and the flash memory 130. The power supply voltage Vin preferably is in the range of, for example, approximately 7 V to approximately 33.5 V. The operating voltage Vout preferably is, for example, approximately 3.3 V.

The step-up converter 150 steps up the power supply voltage Vin to, for example, approximately 33.5 V and supplies the voltage to the backup power supply 160 including MLCCs. The higher the voltage applied to a capacitor, the larger the amount of energy stored in the capacitor (see equation (1)). The function of the step-up converter 150 is to increase the amount of energy stored in the backup power supply 160.

The backup power supply 160 includes one or more MLCCs. In a case where the backup power supply 160 includes a plurality of MLCCs, the MLCCs are connected in series and/or parallel.

One end of the switch 170 is connected to a positive terminal of the backup power supply 160, and the other end of the switch 170 is connected to an input terminal of the step-down converter 140. When the power supply voltage Vin has a normal value, the switch 170 is open and no voltage is supplied from the backup power supply 160.

Figure 2:
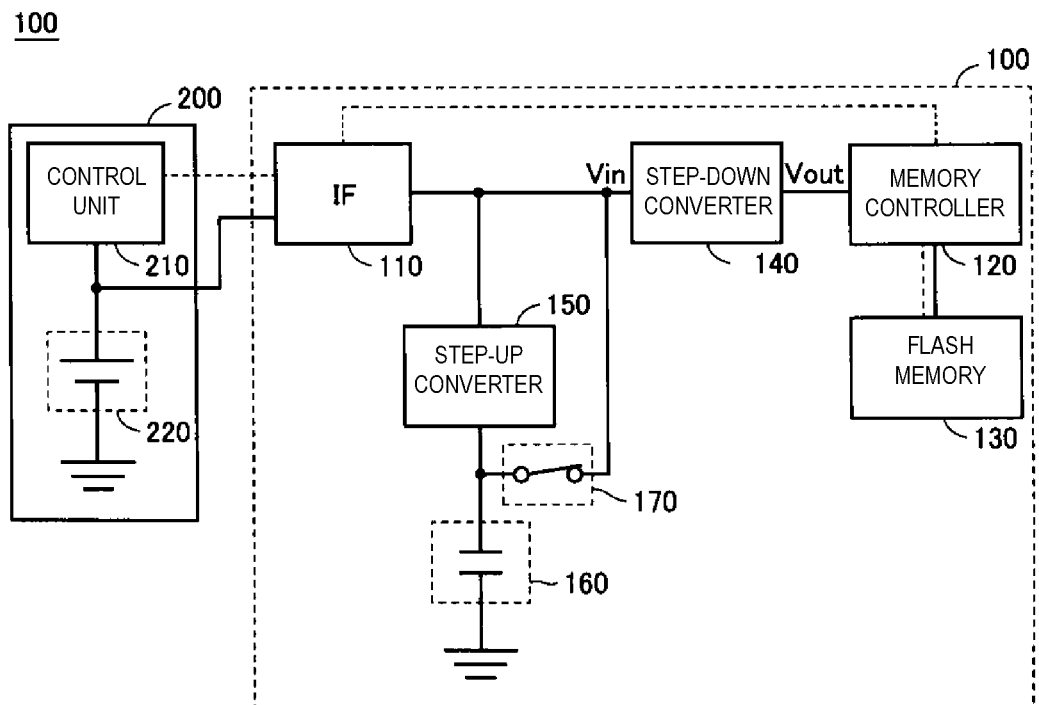
FIG. 2 is a diagram illustrating the functional configuration of the SSD illustrated in FIG. 1 in a case where a power supply voltage is not normally supplied from a power supply.

For example, in a case where a line from the power supply 220 in the host system 200 to the interface 110 is broken and the power supply voltage Vin is not normally supplied from the power supply 220, the switch 170 detects the drop in the power supply voltage Vin and is closed (see FIG. 2). As a result, the power supply voltage Vin is supplied from the backup power supply 160.

In recent years, there have been advances in the reduction in size and profile of the SSD 100. The reduction in profile of the flash memory 130 and the backup power supply 160 is therefore needed.

An MLCC included in the backup power supply 160 includes many thin ceramic layers. By reducing the number of the ceramic layers, the reduction in size and profile of the backup power supply 160 is expected to be achieved.

Figure 3A:
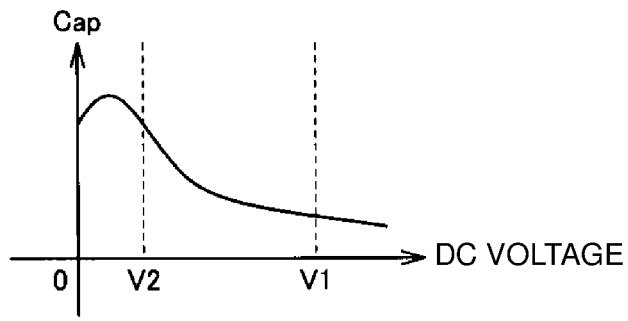
FIGS. 3A, 3B and 3C are diagrams illustrating exemplary characteristics of an MLCC.
Figure 3B:
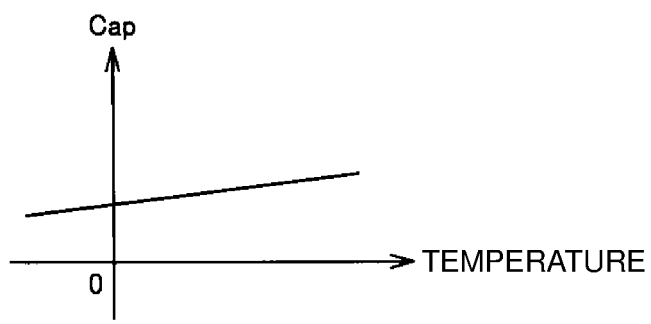
Figure 3C:
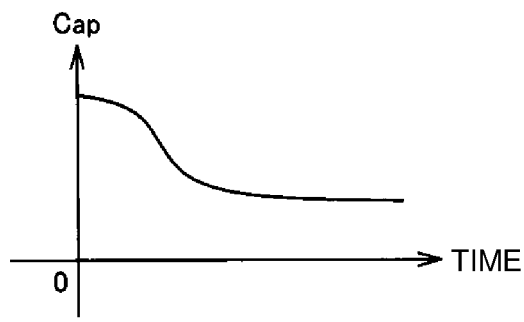

On the other hand, as illustrated in FIGS. 3A, 3B, and 3C, it is known that an MLCC has characteristics in which a capacitance significantly changes in accordance with an applied voltage (see FIG. 3A), a temperature at which a voltage is applied (see FIG. 3B), and a period for which a voltage applied (see FIG. 3C).

A capacitor energy amount calculation method in the related art represented by equation (1) is based on the assumption that the capacitance of a capacitor is substantially constant. In a case where the amount of energy of a capacitor such as an MLCC whose capacitance varies in accordance with a usage environment is calculated using the capacitor energy amount calculation method in the related art, a calculated amount of energy may be away from an actual amount of energy. For example, in a case where the number of MLCCs required as the backup power supply 160 is calculated, the amount of energy of the MLCCs is calculated under the assumption that these MLCCs have the lowest capacitance in a usage environment. As a result, the calculated required number of MLCCs may exceed the actual required number of MLCCs. The increase in the required number of MLCCs makes it difficult to reduce the profile of the backup power supply 160 including the MLCCs difficult because of a limited footprint.

In a preferred embodiment of the present invention, by using an energy amount calculation method that takes an MLCC usage condition into consideration, the amount of energy of MLCCs is appropriately calculated. The required number of MLCCs calculated using a method according to a preferred embodiment of the present invention is smaller than that calculated using a method in the related art. Even though a footprint is limited, the further reduction in size and profile of the SSD 100 is able to be achieved.

Figure 4A:
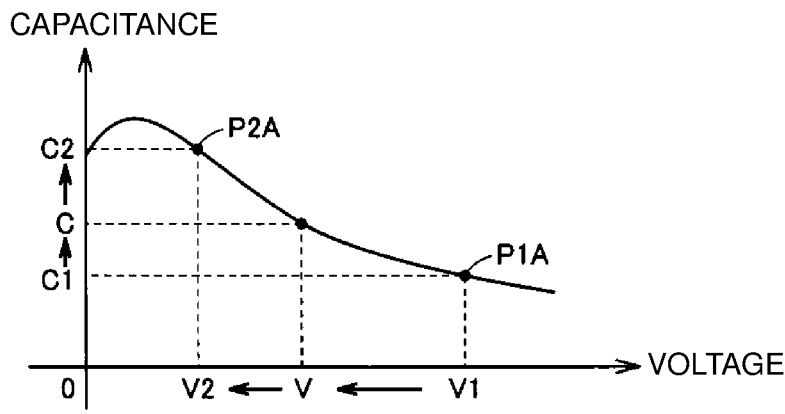
FIGS. 4A, 4B and 4C are diagrams for describing a method of calculating the amount of energy of a capacitor in consideration of characteristics (DC bias characteristics) in which a capacitance changes in accordance with an applied voltage.
Figure 4B:
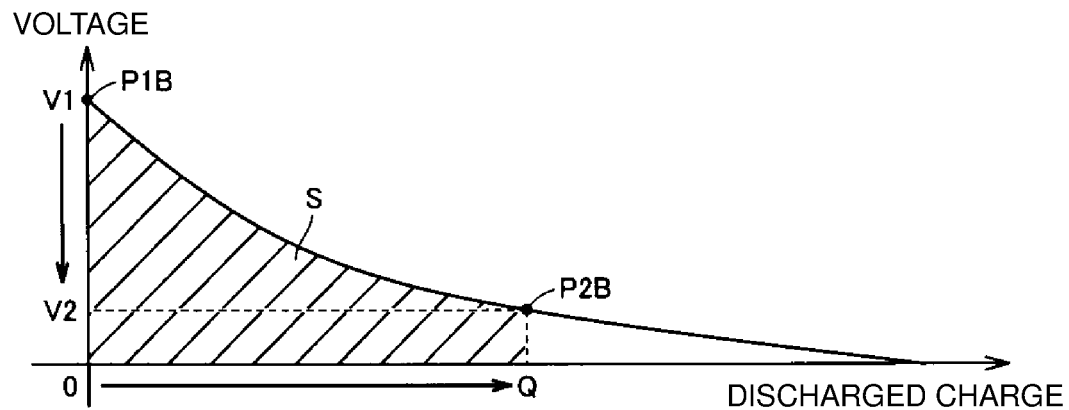
Figure 4C:
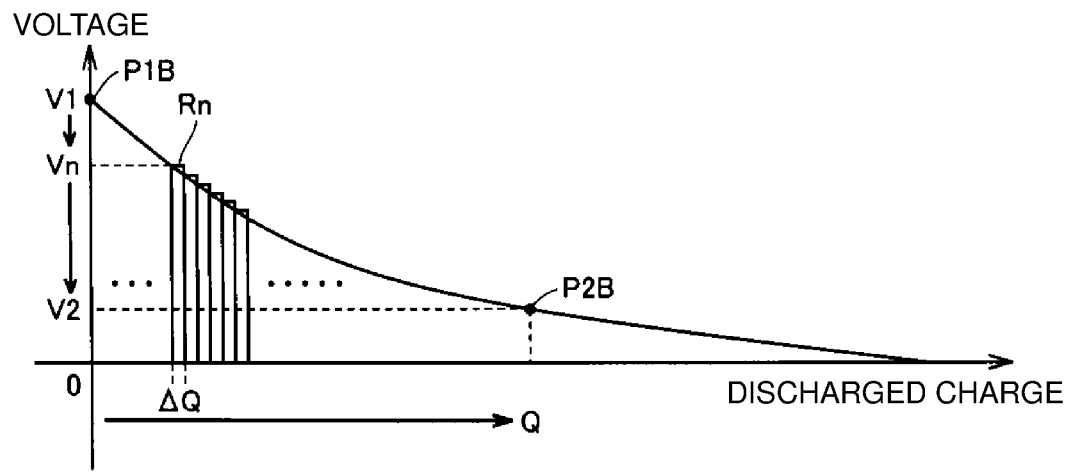

FIGS. 4A, 4B, and 4C are diagrams describing a method of calculating the amount of energy of a capacitor in consideration of characteristics (DC bias characteristics) in which a capacitance changes in accordance with an applied voltage. The voltage of a capacitor usually drops at the time of discharge. In a case where an MLCC is used as a capacitor for a backup power supply to supply power in an emergency, it is necessary to calculate the amount of energy of the capacitor in consideration of DC bias characteristics. FIG. 4A is a diagram illustrating the DC bias characteristics of an MLCC. FIG. 4A is a graph obtained by plotting values calculated on the basis of measurement values and drawing a line that connects these plots.

In a case where a discharge start voltage is V1, a capacitance at the time of start of discharge is C1 as is apparent from FIG. 4A. A charge of $C_1 \cdot V_1$ is stored in a capacitor at the time of start of discharge. Assuming that a capacitance C is obtained when the voltage of the capacitor drops to a voltage V, a charge of $C \cdot V$ is stored in the capacitor. A charge discharged during a voltage drop from V1 to V is obtained by subtracting a charge stored in the capacitor at the voltage V from the charge at the time of start of discharge, and is represented by equation (2).

$$Q = C1 \cdot V1 - C \cdot V \quad (2)$$

FIG. 4B is a diagram obtained by converting the relationship between a voltage and a capacitance represented by the graph in FIG. 4A into the relationship between a discharged charge and a voltage using equation (2). Points P1A and P2A in FIG. 4A correspond to points P1B and P2B in FIG. 4B, respectively. The points P1A and P2A are illustrative only. In reality, the graph illustrated in FIG. 4B is obtained using pieces of data on charges and voltages at points more than the points in FIG. 4A. In a case where a voltage drops from V1 that is a discharge start voltage to V2 that is a discharge end voltage occurs, an energy amount E discharged from a capacitor is equivalent to the area of a hatched portion S in FIG. 4B. That is, the energy amount E can be calculated by integrating the graph illustrated in FIG. 4B from 0 to Q.

FIG. 4C is a diagram describing a process of calculating the approximate value of the area of the hatched portion S in FIG. 4B. First, a horizontal axis from 0 to the charge Q is sectioned at small intervals ΔQ. A voltage Vn corresponding to the integral multiple of ΔQ is calculated. The area of a rectangle Rn (=ΔQ·Vn) having a vertical side corresponding to the voltage Vn and a horizontal side corresponding to the interval ΔQ is calculated. All of rectangles Rn are added. This process of calculating the area (energy amount E) of the hatched portion S is represented by the following equation (3).

$$E = \Sigma Rn \quad (3)$$

The calculation of the amount of energy of a capacitor is generally performed at the time of the circuit design of an electronic apparatus including a backup power supply. A circuit design apparatus 10 that calculates the number of capacitors required for a backup power supply using the calculation method illustrated in FIGS. 4A, 4B, and 4C will be described.

Figure 5:
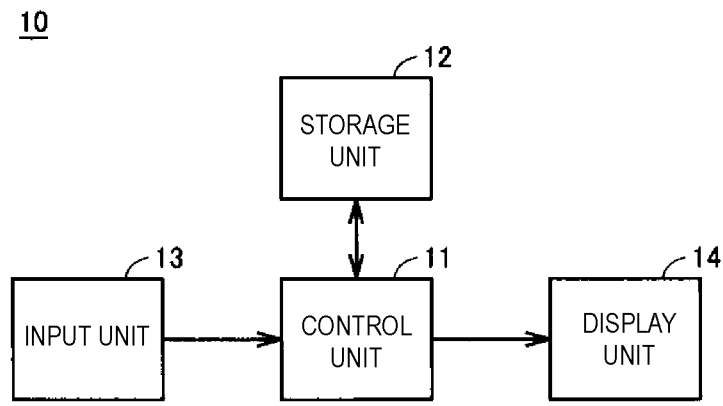
FIG. 5 is a functional block diagram of a circuit design apparatus according to a preferred embodiment of the present invention.

FIG. 5 is a functional block diagram of the circuit design apparatus 10 according to a preferred embodiment of the present invention. As illustrated in FIG. 5, the circuit design apparatus 10 includes a controller 11, a storage 12, an input interface 13, and a display 14.

The controller 11 performs overall control of the circuit design apparatus 10. Although not illustrated in the drawing, the controller 11 includes a central processing unit (CPU) and a volatile memory device. The memory device is, for example, a static random access memory (SRAM) or a dynamic random access memory (DRAM).

The storage 12 stores in advance an operating system (OS) and various application programs such as a computer aided design (CAD) to be read and executed by the controller 11 and various pieces of data (for example, a database for DC bias characteristics) used by these programs.

The input interface 13 can receive a user's input performed for the operation of the circuit design apparatus 10 and transmit a signal based on the input to the controller 11. The input interface 13 includes, for example, a keyboard, a mouse, or a touch panel.

The display 14 performs display processing in accordance with a signal received from the controller 11. The display 14 may be, for example, a liquid crystal display, a plasma display, or an organic electroluminescent display.

In the circuit design apparatus 10, the DC bias characteristics of various MLCCs are registered in a database. DC bias characteristics registered in the database are calculated from data obtained in advance by measurement. More specifically, on the basis of data of measurement with various voltage application temperatures and various voltage application periods, an approximate expression representing DC bias characteristics is calculated for each of the voltage application temperatures and the voltage application periods and is registered in the database.

Figure 6:
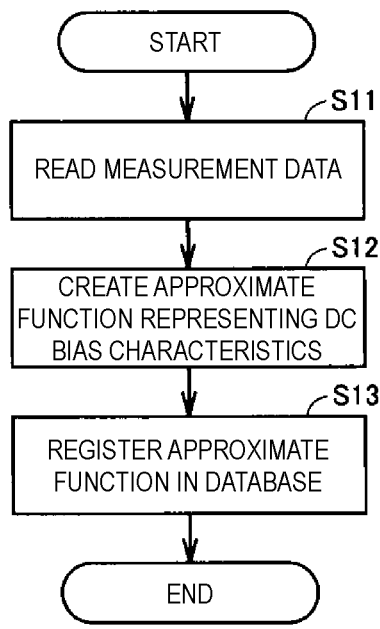
FIG. 6 is a flowchart describing a process of registering in a database an approximate expression representing DC bias characteristics calculated on the basis of measurement data.

FIG. 6 is a flowchart describing a process of registering in a database an approximate expression representing DC bias characteristics calculated on the basis of measurement data. As illustrated in FIG. 6, the controller 11 reads measurement data obtained in step S11 (step will hereinafter be abbreviated as "S"). The process proceeds to S12. The reading of measurement data is performed by, for example, specifying a file in a predetermined format including the measurement data.

In S12, the controller 11 creates an approximate function representing DC bias characteristics. The process proceeds to S13. For the creation of an approximate function, for example, SimSurfing can be used. In S13, the controller 11 registers the approximate function in a database. Information registered in a database is, for example, the list of coefficients of the approximate function.

Figure 7A:
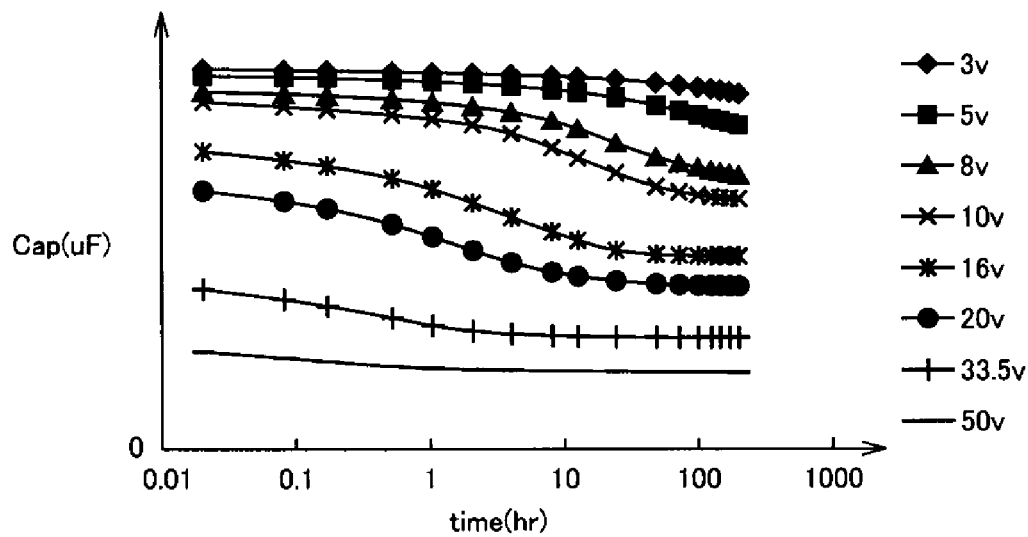
FIGS. 7A and 7B are diagrams illustrating exemplary data obtained in advance by measurement for the calculation of an approximate expression representing DC bias characteristics.
Figure 7B:
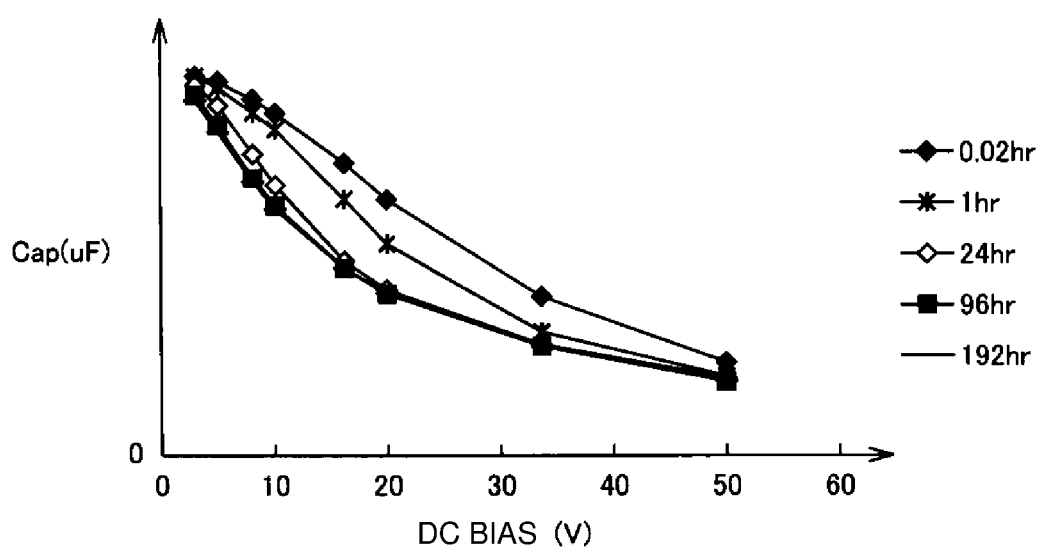

FIGS. 7A and 7B are diagrams illustrating exemplary data obtained in advance by measurement for the calculation of an approximate expression representing DC bias characteristics. FIG. 7A is a graph representing an exemplary change in capacitance in a case where a voltage application temperature is constant and a voltage application period is changed for each applied voltage (for example, approximately 3 V, approximately 5 V, approximately 8 V, approximately 10 V, approximately 16 V, approximately 20 V, approximately 33.5 V, and approximately 50 V). FIG. 7B is a diagram illustrating, on the basis of FIG. 7A, DC bias characteristics corresponding to each voltage application period at a constant voltage application temperature. A relationship between a voltage and a capacitance in a case where a period is held constant is derived from FIG. 7A. FIG. 7B illustrates graphs representing this relationship in a case where a voltage application period is approximately 0.02 hours (1.2 minutes), approximately 1 hour, approximately 24 hours, approximately 96 hours, and approximately 192 hours, for example. In a database, an approximate expression representing each graph illustrated in FIG. 7B is registered.

Figure 8:
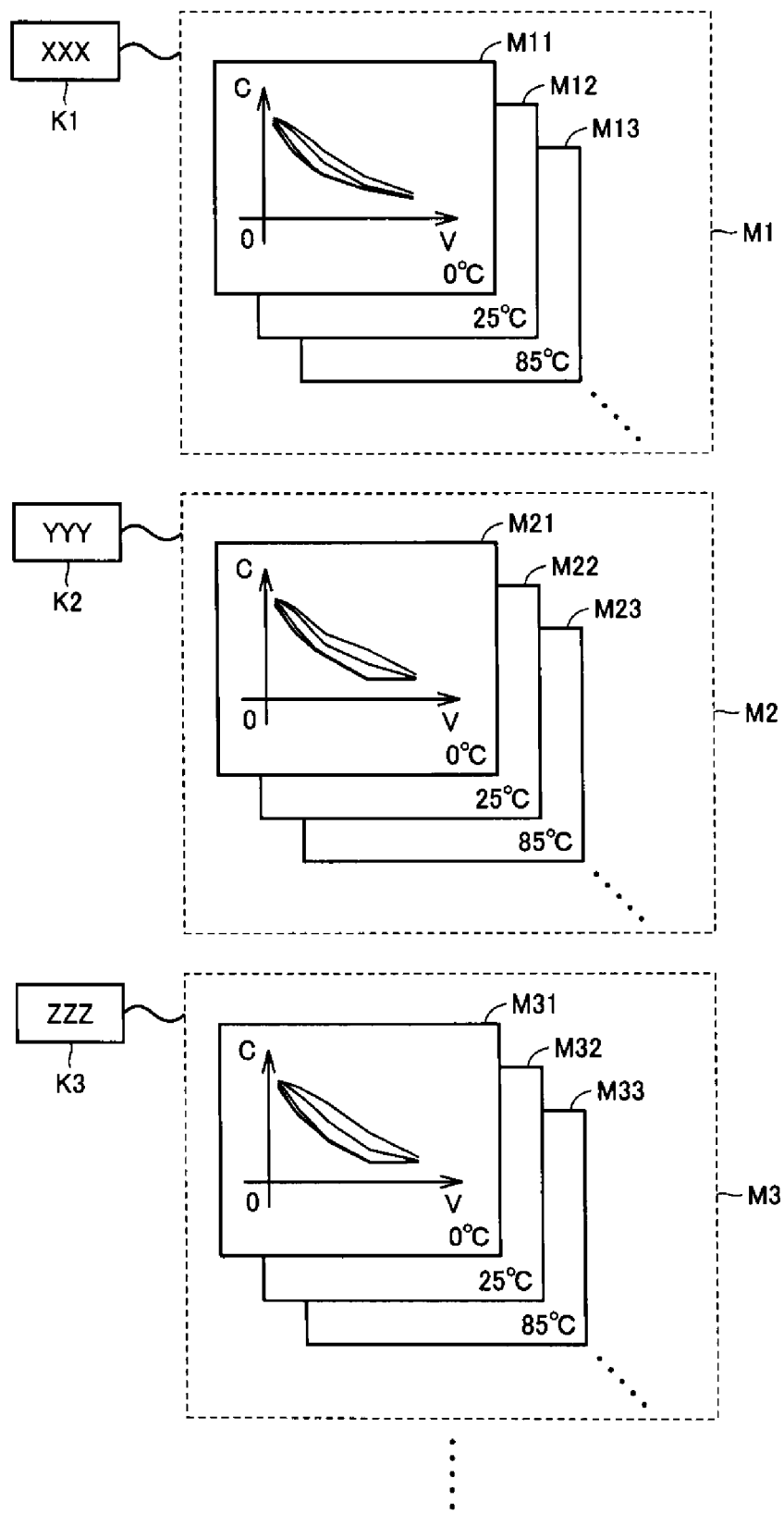
FIG. 8 is a diagram illustrating an exemplary data structure of a database.

FIG. 8 is a diagram illustrating an exemplary data structure of a database. As illustrated in FIG. 8, keys K1, K2, and K3 are associated with pieces of data M1, M2, and M3, respectively. Examples of a key include the serial number, name, material, a voltage application period, and a voltage application temperature of an MLCC. Data includes DC bias characteristics corresponding to a voltage application period at each voltage application temperature. For example, the data M1 associated with the key K1 includes DC bias characteristics M11 at a voltage application temperature of approximately 0° C., DC bias characteristics M12 at a voltage application temperature of approximately 25° C., and DC bias characteristics M13 at a voltage application temperature of approximately 85° C. The data M2 associated with the key K2 and the data M3 associated with the key K3 similarly includes DC bias characteristics.

FIG. 9 is a flowchart describing a process of calculating the amount of energy of a capacitor. As illustrated in FIG. 9, in S21, the controller 11 receives information specifying the characteristics of a capacitor and the usage condition of the capacitor which are input by a user. Examples of information specifying the characteristics of a capacitor include the serial number, name, and material of an MLCC. Examples of the usage condition of the capacitor include a discharge start voltage, a discharge end voltage, a voltage application temperature, and a voltage application period. In S22, the controller 11 acquires from a database an approximate expression representing DC bias characteristics corresponding to the information input in S21. In S23, the controller 11 calculates the amount of energy using the method acquired in S22 (described with reference to FIGS. 4A to 4C). In S24, the controller 11 displays a result of the calculation on the display 14.

FIG. 10 is a diagram illustrating an example of a screen used to input information specifying the characteristics of a capacitor and the usage condition of the capacitor. As illustrated in FIG. 10, as information specifying the characteristics of a capacitor, a chip name (a serial number or a product name) and a material are input (corresponding to S21 in FIG. 9). As the usage conditions of the capacitor, a voltage application temperature, a voltage application period (voltage aging), a discharge start voltage, and a discharge end voltage are input (corresponding to S21 in FIG. 9). In addition, in order to calculate the number of chips, the required amount of energy of a backup power supply is input. On the basis of the input pieces of information, an approximate expression is acquired from a database (corresponding to S22 in FIG. 9). Using the acquired approximate expression, the amount of energy per chip is calculated (corresponding to S23 in FIG. 9). On the basis of the amount of energy per chip and the required amount of energy, the required number of chips is calculated. More specifically, the required number of chips is calculated by dividing the required amount of energy by the amount of energy per chip (corresponding to S24 in FIG. 9). For example, referring to FIG. 10, since the required amount of energy is approximately 40 mJ and the amount of energy per chip is approximately 1.00 mJ, the required number of chips becomes approximately 40.

FIGS. 11A and 11B are diagrams describing exemplary application of an energy calculation method according to a preferred embodiment of the present invention. FIG. 11A is a diagram illustrating the comparison between results of calculation of the number of a specific type of chips required to acquire the required amount of energy using a method in the related art and a method according to a preferred embodiment of the present invention. As illustrated in FIG. 11A, the required amount of energy is approximately 40 mJ, a voltage application temperature is approximately 85° C., a voltage application period (aging) is approximately 5 years, a discharge start voltage is approximately 33.5 V, and a discharge end voltage is approximately 7 V, for example. In a database according to a preferred embodiment of the present invention, DC bias characteristics based on measurement data corresponding to a voltage application temperature of approximately 85° C. and a voltage application period of 5 years are registered, for example. A capacitance is measured by an LCR meter.

The number of chips required to acquire the required amount of energy calculated using a method according to a preferred embodiment of the present invention is reduced by approximately 18% as compared with that calculated using a method in the related art. In a calculation method according to a preferred embodiment of the present invention, the amount of energy of a capacitor is calculated in consideration of a capacitance that varies in accordance with a usage condition. The amount of energy per chip calculated using a method according to a preferred embodiment of the present invention is therefore larger than that calculated using a method in the related art. As a result, the required number of chips is able to be reduced.

FIG. 11B is a diagram illustrating a result of the comparison between an actually measured capacitor energy value and the amount of energy calculated using a method according to a preferred embodiment of the present invention. As illustrated in FIG. 11B, an error between an actually measured value and the amount of energy calculated according to a preferred embodiment of the present invention is approximately 0.5%, for example.

FIGS. 12A, 12B, and 12C are diagrams illustrating results of the comparison between an actually measured capacitor energy value and the amount of energy calculated using a method according to a preferred embodiment of the present invention under usage conditions different from that in FIG. 11B. FIG. 12A is a diagram illustrating a result of the above-described comparison in a case where a voltage application temperature is approximately 0° C. Referring to FIG. 12A, a voltage application period is approximately 1 minute, a discharge end voltage is approximately 7 V, and a discharge start voltage is approximately 33.5 V or approximately 20 V, for example. As illustrated in FIG. 12A, in a case where a discharge start voltage is approximately 33.5 V, the maximum absolute value of an error between an actually measured value and a calculated value is approximately 5.8% (sample D), for example. In a case where a discharge start voltage is approximately 20 V, the maximum absolute value of an error between an actually measured value and a calculated value is approximately 5.5% (sample C), for example.

FIG. 12B is a diagram illustrating a result of the above-described comparison in a case where a voltage application temperature is approximately 25° C. Referring to FIG. 12B, a voltage application period is approximately 48 hours, a discharge end voltage is approximately 7 V, and a discharge start voltage is approximately 33.5 V or approximately 20 V, for example. As illustrated in FIG. 12B, in a case where a discharge start voltage is approximately 33.5 V, the maximum absolute value of an error between an actually measured value and a calculated value is approximately 6.1% (sample A), for example. In a case where a discharge start voltage is approximately 20 V, the maximum absolute value of an error between an actually measured value and a calculated value is approximately 3.5% (sample A), for example.

FIG. 12C is a diagram illustrating a result of the above-described comparison in a case where a voltage application temperature is approximately 85° C. Referring to FIG. 12C, a voltage application period is approximately 24 hours, a discharge start voltage is approximately 33.5 V, and a discharge end voltage is approximately 7 V, for example. As illustrated in FIG. 12C, the maximum absolute value of an error between an actually measured value and a calculated value is approximately 2.4% (sample C), for example.

As is apparent from pieces of data illustrated in FIGS. 11B and 12A to 12C, the maximum absolute value of an error between an actually measured energy value and a value calculated using a method according to a preferred embodiment of the present invention is approximately 6%, for example. On the other hand, in a case where a calculation method in the related art is used, the absolute value of an error between an actually measured value of approximately 41.3 mJ and a calculated value of approximately 33.3 mJ becomes approximately 19%.

Thus, using the circuit design apparatus 10, it is possible to appropriately calculate the amount of energy of a capacitor by using an energy amount calculation method that takes a usage condition into consideration. The required number of capacitors calculated using a method according to a preferred embodiment of the present invention becomes smaller than that calculated using a method in the related art. Even though a footprint is limited, the further reduction in size and profile of a flash memory is therefore achieved.

It should be understood that the above-described preferred embodiments are illustrative only and are not intended to limit the scope of the present invention. The scope of the present invention should be determined in view of the appended claims. Accordingly, equivalents to the appended claims and all modifications of various preferred embodiments of the present invention which fall within the scope of the present invention are intended to be encompassed in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit design apparatus comprising:
  a storage that stores a first capacitance of a capacitor associated with one or more usage conditions; and
  a controller that controls an amount of energy of the capacitor under a specified usage condition of the one or more usage conditions; wherein
  the controller calculates a second capacitance under the specified usage condition based on a first relationship between the specified usage condition and the first capacitance, and calculates the amount of energy of the capacitor based on the calculated second capacitance.

2. The circuit design apparatus according to claim 1, wherein the controller calculates the second capacitance under the specified usage condition using an approximate expression derived from the first relationship.

3. The circuit design apparatus according to claim 2, wherein
  the storage includes a database that registers the approximate expression for which one or more pieces of information specifying capacitor characteristics are set as search keys; and
  the controller acquires the approximate expression from the database by using a specified one of the pieces of information as a search key.

4. The circuit design apparatus according to claim 3, wherein the pieces of information include at least one of an identifier and a material of the capacitor.

5. The circuit design apparatus according to claim 1, wherein the one or more usage conditions include at least one of a voltage applied to the capacitor, a period for which the voltage is applied, and a temperature at which the voltage is applied.

6. The circuit design apparatus according to claim 1, wherein the controller calculates the amount of energy by calculating a sum of products of a voltage and a charge in a period from a discharge start time to a discharge end time at the capacitor using a second relationship between a voltage applied to the capacitor and a charge stored in the capacitor which is derived from the first relationship.

7. The circuit design apparatus according to claim 6, wherein
  the controller calculates the amount of energy per capacitor; and
  the controller calculates a required number of capacitors for a power supply based on the amount of energy per capacitor.

8. The backup power supply according to claim 1, wherein the capacitor is a multi-layer ceramic capacitor.

9. The circuit design apparatus according to claim 1, wherein the amount of energy is obtained by integrating pieces of data on charges stored in the capacitor from a discharge start voltage to a discharge end voltage of the capacitor.

10. The circuit design apparatus according to claim 1, wherein an approximate value of the amount of energy is calculated by adding all areas of rectangles $Rn$ ($=\Delta Q \cdot Vn$) from a discharge start voltage to a discharge end voltage of the capacitor where a discharged charge Q from the discharge start voltage to the discharge end voltage is sectioned at intervals $\Delta Q$ and a voltage $Vn$ corresponds to an integral multiple of $\Delta Q$ and an area of each rectangle $Rn$ ($=\Delta Q \cdot Vn$) has a vertical side corresponding to the voltage $Vn$ and a horizontal side corresponding to the interval $\Delta Q$.

11. A capacitor energy amount calculation method for a circuit design apparatus including a storage that stores a first capacitance of a capacitor associated with one or more usage conditions and a controller that controls an amount of energy of the capacitor under a specified usage condition of the one or more usage conditions, the capacitor energy amount calculation method being performed by the controller and comprising:
  calculating a second capacitance under the specified usage condition based on a first relationship between the specified usage condition and the first capacitance; and
  calculating the amount of energy of the capacitor based on the calculated second capacitance.

12. The method according to claim 11, wherein the controller calculates the second capacitance under the specified usage condition using an approximate expression derived from the first relationship.

13. The method according to claim 12, wherein
  the storage includes a database that registers the approximate expression for which one or more pieces of information specifying capacitor characteristics are set as search keys; and
  the controller acquires the approximate expression from the database by using a specified one of the pieces of information as a search key.

14. The method according to claim 13, wherein the pieces of information include at least one of an identifier and a material of the capacitor.

15. The method according to claim 11, wherein the one or more usage conditions include at least one of a voltage applied to the capacitor, a period for which the voltage is applied, and a temperature at which the voltage is applied.

16. The method according to claim 11, wherein the controller calculates the amount of energy by calculating a sum of products of a voltage and a charge in a period from a discharge start time to a discharge end time at the capacitor using a second relationship between a voltage applied to the capacitor and a charge stored in the capacitor which is derived from the first relationship.

17. The method according to claim 16, wherein
  the controller calculates the amount of energy per capacitor; and
  the controller calculates a required number of capacitors for a power supply based on the amount of energy per capacitor.

18. The method according to claim 11, wherein the capacitor is a multi-layer ceramic capacitor.

19. The method according to claim 11, wherein the amount of energy is obtained by integrating pieces of data on charges stored in the capacitor from a discharge start voltage to a discharge end voltage of the capacitor.

20. The method according to claim 11, wherein an approximate value of the amount of energy is calculated by adding all areas of rectangles Rn (=ΔQ·Vn) from a discharge start voltage to a discharge end voltage of the capacitor where a discharged charge Q from the discharge start voltage to the discharge end voltage is sectioned at intervals ΔQ and a voltage Vn corresponds to an integral multiple of ΔQ and an area of each rectangle Rn (=ΔQ·Vn) has a vertical side corresponding to the voltage Vn and a horizontal side corresponding to the interval ΔQ.

* * * * *